United States Patent [19]
Takaishi et al.

[11] Patent Number: 5,418,455
[45] Date of Patent: May 23, 1995

[54] MAGNETIC POSITION DETECTOR HAVING A MAGNETIC SENSOR ELEMENT AND A CIRCUIT BOARD HAVING A SELECTIVELY CHANGEABLE WIRING PATTERN

[75] Inventors: Tadao Takaishi; Tokuo Marumoto, both of Himeji, Japan

[73] Assignee: Mitsubishi Denki Kabushiki Kaisha, Tokyo, Japan

[21] Appl. No.: 13,084

[22] Filed: Feb. 3, 1993

[30] Foreign Application Priority Data

Feb. 5, 1992 [JP] Japan .................. 4-019872

[51] Int. Cl.⁶ .................. G01B 7/30; G01D 5/18; H05K 1/00; H01R 29/00
[52] U.S. Cl. .................. 324/207.21; 29/846; 29/847; 174/261; 324/207.25; 361/778; 439/189
[58] Field of Search .......... 324/207.2, 207.21, 207.25; 439/516, 518, 189; 174/261; 361/760, 772, 777, 778; 29/846, 847

[56] References Cited
U.S. PATENT DOCUMENTS 4,950,169  8/1990  Martin et al. .......... 439/516 X
5,112,230  5/1992  DeSimone .......... 439/516 X

FOREIGN PATENT DOCUMENTS 4014885  of 1990  Germany .
197188   of 1990  Japan .
2238320  9/1990   Japan .
2298815  12/1990  Japan .

Primary Examiner—Gerard R. Strecker
Attorney, Agent, or Firm—Sughrue, Mion, Zinn, Macpeak & Seas

[57] ABSTRACT

A method for manufacturing a position detector having a movable permanent magnet (5) and a circuit board (6) having a magnetic sensor circuit (10~13) mounted thereon for detecting the displacement of the permanent magnet. A selective connection portion (8,9) in the magnetic sensor circuit capable of being selectively placed into at least two different circuit patterns exhibiting two different output characteristics (A,B) is provided. Then, the connection in the selective connection portion (8,9) is changed by adding an electrical conductor (FIGS. 1a, 1b) or removing (FIGS. 2a, 2b) portions of pattern conductors in the selective connection portion (8,9) to place the magnetic sensor circuit into either one of the at least two different circuit patterns (FIGS. 4,5) according to necessity.

4 Claims, 4 Drawing Sheets a position detector and, more particularly, to a position detector in which a movement of a permanent magnet is detected by a magnetic sensor element as a change in magnetic flux.

MAGNETIC POSITION DETECTOR HAVING A MAGNETIC SENSOR ELEMENT AND A CIRCUIT BOARD HAVING A SELECTIVELY CHANGEABLE WIRING PATTERN

BACKGROUND OF THE INVENTION

This invention relates to a position detector and, more particularly, to a position detector in which a movement of a permanent magnet is detected by a magnetic sensor element as a change in magnetic flux.

FIGS. 3 and 4 illustrate a related position detector in sectional view and circuit diagram, respectively. In these figures, the position detector comprises a magnetic sensor element 1 which includes a pair of magnetoresistance elements 1a and 1b made of NiFe ferromagnetic magnetoresistive material formed in a magnetoresistive pattern on a glass substrate. The magnetoresistance elements 1a and 1b are molded in a substantially rectangular insulating resin so that a magnetic sensing surface is formed by the magnetoresistance elements 1a and 1b on the glass substrate surface.

Reference numeral 2 designates a position detector mold case made for example of a polybuthyleneterephthalate resin, 3 is a rotary shaft rotatably mounted to the case 2, and 4 is an arm secured to one end of the rotary shaft.

Reference numeral 5 is a cylindrical permanent magnet secured to the other end of the rotary shaft 3, and 6 is a ceramic substrate serving as a circuit board on which a sensor circuit including a wiring pattern and various electronic components are mounted, the magnetic sensor element 1 being mounted on the ceramic circuit board 6 with its magnetic sensing surface placed in parallel to the substrate surface. Reference numeral 7 designates a terminal for taking out an output from the magnetic sensor element 1.

The ceramic circuit board 6 is inserted within the case 2 with its board surface perpendicular to the permanent magnet 5 or, that is, with the magnetic field from the permanent magnet 5 passing in parallel across the magnetic sensing surface of the magnetic sensor element 1.

Reference numeral 10 designates a Wheatstone bridge composed of the magnetoresistance elements 1a and 1b and reference voltage setting resistors R1 and R2, 11 is a temperature-compensated constant current circuit, 12 is a differential amplifier circuit, 13 is a level shift circuit and 14 is an output terminal of the level shift circuit 13.

When the position detector is applied to a throttle valve (not shown) of an internal combustion engine (not shown), the arm 4 is rotated in accordance with the opening degree of the throttle valve within an air-intake pipe of a vehicular engine, the rotation of the arm 4 is transmitted to the permanent magnet 5 through the rotary shaft 3. As the permanent magnet 5 rotates, the direction of magnetic flux passing in parallel across the magnetic sensing surface of the magnetic sensor element 1 changes, in accordance with which the resistance of the magnetoresistance pattern of the magnetoresistance elements 1a and 1b changes.

Accordingly, as the resistance of the magnetoresistance elements 1a and 1b varies, the output voltage from the output terminal O1 of the Wheatstone bridge 10 varies. At this time, the resistance values of the resistors R1 and R2 do not vary and a constant reference voltage is provided from the output terminal O2.

The output voltages supplied from the output terminals O1 and O2 of the bridge 10 are supplied to the input terminals I2 and I1, respectively, of the differential amplifier 12 where they are amplified and a difference between the two output voltages is generated at the level shift circuit 13 and the difference signal is supplied from the output terminal 14. This output voltage which has an output voltage waveform corresponding to a rotational angle of the permanent magnet 5 is supplied to an external apparatus (not shown) through the terminal 7 to indicate the opening degree of the throttle valve.

FIG. 5 illustrates another sensor circuit for use in a different application in which a negative characteristic output voltage waveform is required. As seen from FIG. 5, the output terminals O1 and O2 of the Wheatstone bridge 10 are connected to the input terminals I1 and I2, respectively, of the differential amplifier 12 so that the output terminal 14 supplies an output voltage waveform B shown in FIG. 6 exhibiting opposite characteristic as compared to the waveform A of the sensor circuit shown in FIG. 4.

According to the above-described related position detector, in order to provide two kinds of position detectors having two opposite polarity output characteristics in accordance with the application, it has been necessary to prepare and store two kinds of ceramic circuit boards 6 on which different sensor circuits are formed. Therefore, the number of parts to be manufactured and administrated is increased.

SUMMARY OF THE INVENTION

Accordingly, one object of the present invention is to provide a position detector free from the above-discussed problems of the related position detector.

Another object of the present invention is to provide a position detector which makes the manufacture of two kinds of position detectors having two different output characteristics easy.

Another object of the present invention is to provide a method for manufacturing the position detector in which two kinds of position detectors having two different output characteristics can be easily selectively manufactured without the need for preparing and maintaining two different magnetic sensor circuits.

With the above objects in view, the position detector of the present invention comprises a permanent magnet and a circuit board having a magnetic sensor element mounted on it for detecting the displacement of the permanent magnet as a change in magnetic flux passing across the magnetic sensor element. The circuit pattern of the circuit board can be arranged by setting a jumper chip on the circuit board. The circuit pattern of the circuit board may be arranged by removing a wiring pattern on the circuit board.

The method for manufacturing a position detector comprises the steps of providing a selective connection portion in the magnetic sensor circuit capable of being selectively placed into at least two different circuit patterns exhibiting two different output characteristics, and changing the connection in the selective connection portion to place the magnetic sensor circuit into either one of the at least two different circuit patterns.

The selective connection portion may comprise two pairs of conductor patterns for two opposite polarity output characteristics, and the connection changing step may comprise removing part of either one of the two pairs of the conductor patterns or selectively connecting the two pairs of connection terminals by soldering two jumper chips across the terminals.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 3:
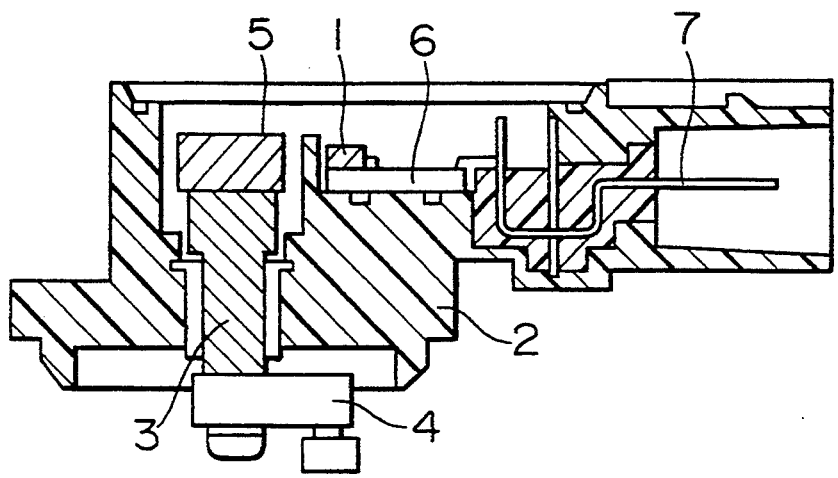
FIG. 3 is a sectional side view of a related position detector to which the present invention can be applied.

A position detector of the present invention has a basic structure similar to the related position detector illustrated in FIG. 3 so that the description of those portions of the position detector of the present invention identical or similar to the related position detector will be made only briefly.

Similarly to the position detector illustrated in FIGS. 3 to 6, the position detector of the present invention comprises a permanent magnet 5 rotatably supported in a mold case 2 and a ceramic circuit board 6 having a magnetic sensor circuit. The sensor circuit comprises a circuit pattern including a magnetic sensor element 1 and an electronic circuit 11, 12 and 13 illustrated in FIG. 4 for detecting the rotation of the permanent magnet 5 as a change in direction of magnetic flux passing across the magnetic sensor element 1. According to the present invention, as illustrated in FIGS. 1a and 1b, the circuit pattern of the circuit board can be arranged by setting jumper chips 16 on the circuit board.

The magnetic sensor circuit includes a wiring pattern and various electronic components on the circuit board 6, and the terminal 7 for taking out an output from the magnetic sensor element 1 is provided.

Figure 1A:
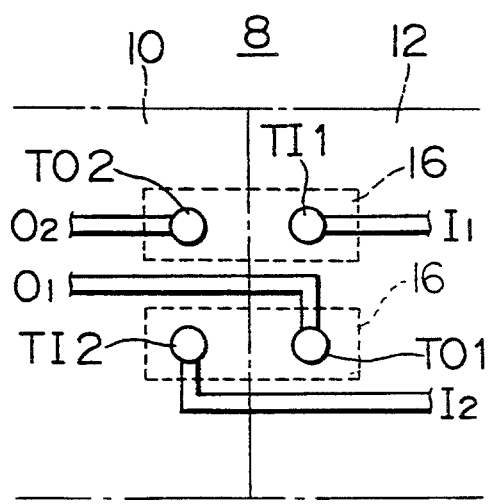
FIG. 1a is a schematic plan view illustrating the selective connection portion of the position detector of the present invention, the selective connection portion being in a first position.
Figure 1B:
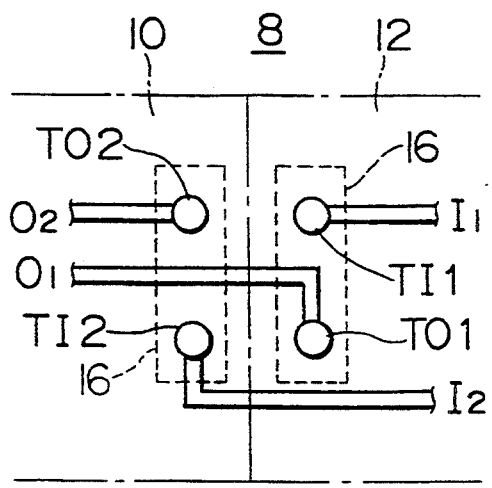
FIG. 1b is a schematic plan view illustrating the selective connection portion of the position detector of the present invention, the selective connection portion being in a second position.
Figure 4:
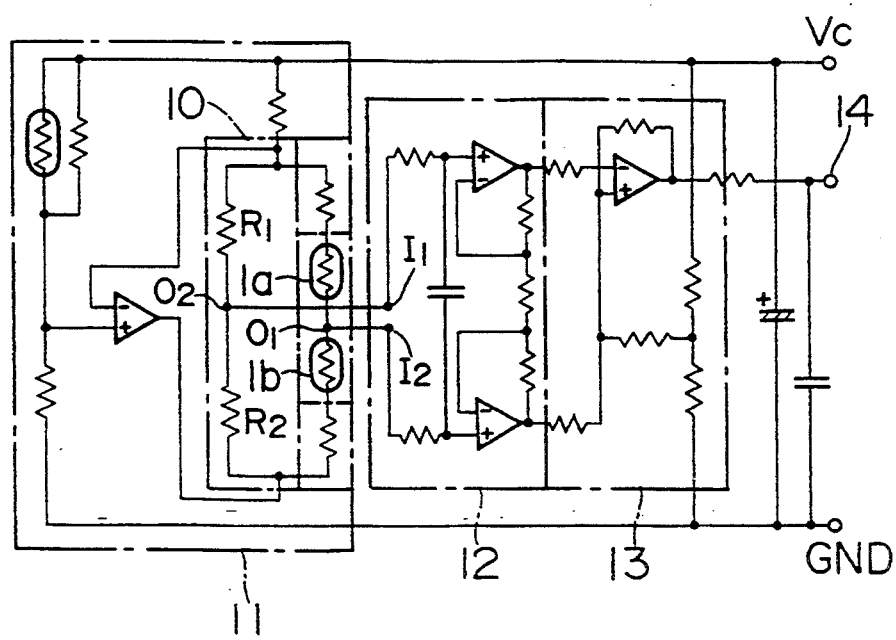
FIG. 4 is a circuit diagram of the position detector illustrated in FIG. 3, the sensor circuit having a first pattern.
Figure 5:
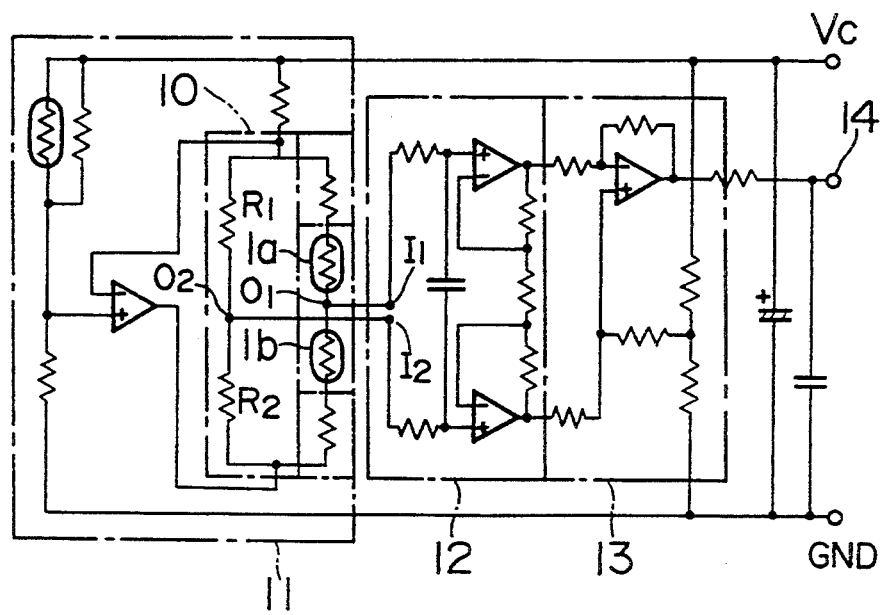
FIG. 5 is a circuit diagram of the position detector illustrated in FIG. 3, the sensor circuit having a second pattern.

FIGS. 1a and 1b illustrate a selective connection portion 8 of the pattern conductors disposed between the temperature-compensated constant current circuit 11 and the differential amplifier 12 illustrated in FIG. 4. The selective connection portion 8 comprises two output terminals TO1 and TO2 which are output terminals of the Wheatstone bridge circuit 10, and two input terminals TI1 and TI2 which are input terminals of the differential amplifier circuit 12. The terminals TO1, TO2, TI1 and TI2 are preferably formed by solder bumps for reflow soldering.

In FIG. 1a, the first output terminal TO1 is connected to the second input terminal TI2 by an electrical conductor such as a jumper chip 16 reflow-soldered to the terminals TO1 and TI2. The reflow-soldering of the jumper chip 16 may be achieved simultaneously with the soldering of other electronic components to the circuit board 6. The second output terminal TO2 is connected to the first input terminal TI1 by a similar electrical conductor 16 soldered to the terminals TO2 and TI1. In the illustrated embodiment, since two output terminals TO1 and TO2 and two input terminals TI1 and TI2 are diagonally arranged in the equidistantly arranged four terminal arrangement, straight jumper chips 16 can be used to realize the above-described crisscross connection. With this connection illustrated in FIG. 1a, which corresponds to the circuit illustrated in FIG. 4, output voltage characteristics depicted by the waveform A in FIG. 6 can be obtained.

Figure 6:
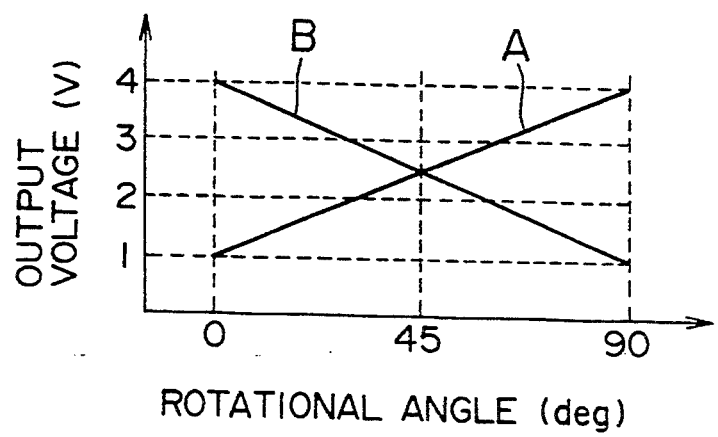
FIG. 6 is a graph showing two opposite polarity output characteristics of the position detector.

When it is desired that the position detector has output voltage characteristics exhibiting the waveform B in FIG. 6 which is opposite in polarity with respect to the waveform A, the jumper chips 16 are provided as illustrated in FIG. 1b.

In FIG. 1b, the first output terminal TO1 is connected to the first input terminal TI1 by a jumper chip 16 reflow-soldered to the terminals TO1 and TI1. The second output terminal TO2 is connected to the second input terminal TI2 by a similar electrically conductive jumper chip 16 soldered to the terminals TO2 and TI2. Again, these electrical connections can be easily realized by means of straight-line jumper chips 16. With this connection illustrated in FIG. 1b, which corresponds to the circuit shown in FIG. 5, output voltage characteristics depicted by the waveform B in FIG. 6 can be obtained.

Figure 2A:
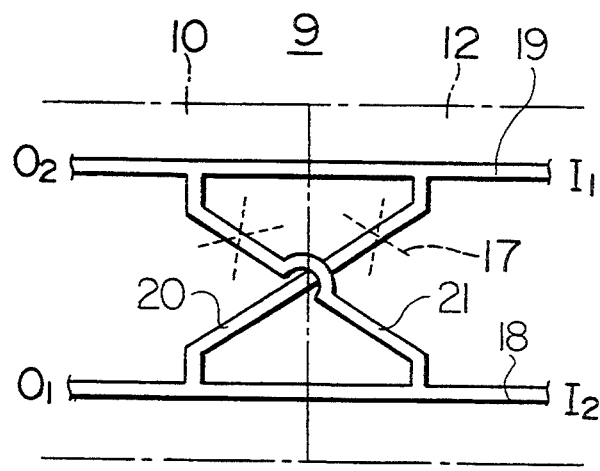
FIG. 2a is a schematic plan view illustrating another selective connection portion of the position detector of the present invention, the selective connection portion being in a first position.
Figure 2B:
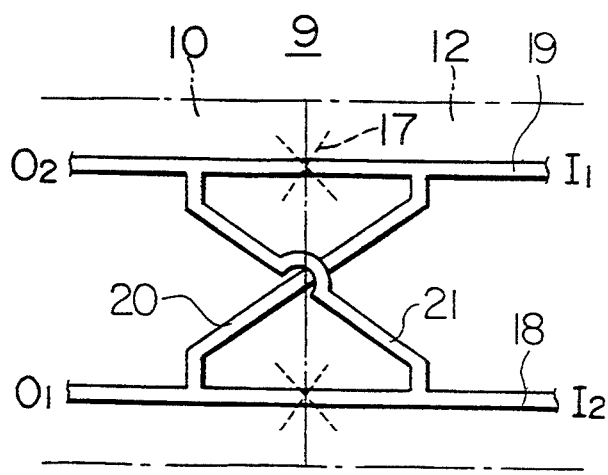
FIG. 2b is a schematic plan view illustrating another selective connection portion of the position detector of the present invention, the selective connection portion being in a second position.

FIGS. 2a and 2b illustrate a modification of the selective connection portion 9 of the pattern conductors of the magnetic sensor circuit. The selective connection portion 9 comprises two parallel conductors 18 and 19 and two crossing diagonal conductors 20 and 21. The first parallel conductor 18 is connected between the first output 01 of the bridge circuit 10 and the second input I2 of the amplifier circuit 12 and the second parallel conductor 19 is connected between the second output 02 of the bridge circuit 10 and the first input I1 of the amplifier circuit 12. The first diagonal conductor 20 is connected between the first output 01 and the first input I1 and the second diagonal conductor 21 is connected between the second output 02 and the second input I2.

Therefore, by removing or cutting some portions (e.g. as indicated as portions 17) of the pattern conductors, the circuit pattern can be modified. When the circuit shown in FIG. 4 which provides the waveform A is desired, the first and the second diagonal conductors 20 and 21 are removed to disconnect the first input I1 from the first output 01 and to disconnect the second input I2 from the second output 02. When the circuit shown in FIG. 5 which provides the waveform B is desired, the first and the second parallel conductors 18 and 19 are removed to disconnect the first input I1 from the second output 01 and to disconnect the second input I2 from the first output 02. This removal of the conductors may be achieved by any suitable well-known method. In order to prevent two crossing conductors 20 and 21 from being brought into contact, a suitable electrically insulating layer is disposed therebetween.

While the selective connection portion 8 and 9 of the position detector of the present invention has been described as being disposed between the bridge circuit 10 and the differential amplifier circuit 12, the selective connection portion may be positioned at any suitable position in the magnetic sensor circuit. For example, the selective connection portion may be disposed between the differential amplifier circuit 12 and the level shift circuit 13.

As has been described, according to the position detector of the present invention, the magnetic sensor circuit pattern of the circuit board can be arranged by setting a jumper chip on the circuit board or the circuit pattern of the circuit board may be arranged by removing a wiring pattern on the circuit board.

According to the method for manufacturing a position detector, a selective connection portion in the magnetic sensor circuit capable of being selectively placed into at least two different circuit patterns exhibiting two different output characteristics is prepared, and the electrical connection in the selective connection portion is modified to place the magnetic sensor circuit into either one of the at least two different circuit patterns.

Therefore, two kinds of position detectors having two different output characteristics can be easily selectively manufactured without the need for preparing and maintaining two different magnetic sensor circuits.

What is claimed is:

1. A position detector comprising: a permanent magnet;
   a circuit board having a selectably changeable circuit pattern and a magnetic sensor element mounted thereon for detecting the displacement of said permanent magnet as a change in magnetic flux passing across said magnetic sensor element, said circuit pattern comprising first, second and third circuit paths terminating at first, second and third terminals, respectively; and
   a jumper chip for selectably connecting said first terminal to said second and third terminals to cause said circuit pattern to be a first circuit pattern when said jumper chip connects said first terminal to said second terminal to enable said first circuit pattern to provide, at an output thereof, a first signal based on the displacement of said permanent magnet, and to cause said circuit pattern to be a second circuit pattern, different from said first circuit pattern, when said jumper chip connects said first terminal to said third terminal to enable said second circuit pattern to provide, at an output thereof, a second signal based on the displacement of said permanent magnet.

2. A method for manufacturing a position detector having a movable permanent magnet and a circuit board having a selectably changeable circuit pattern and a magnetic sensor element mounted thereon for detecting the displacement of said permanent magnet as a change in magnetic flux passing across said magnetic sensor element, the method comprising the steps of:
   providing a selective connection portion in said circuit pattern having
      first, second and third circuit paths terminating at first, second and third terminals, respectively; and
   changing the connection in said selective connection portion to cause said circuit pattern to be one of at least two different circuit patterns by
      using a jumper chip to selectably connect said first terminal to said second and third terminals to cause said circuit pattern to be a first circuit pattern when said jumper chip connects said first terminal to said second terminal to enable said first circuit pattern to provide, at an output thereof, a first signal based on the displacement of said permanent magnet, and to cause said circuit pattern to be a second circuit pattern, different from said first circuit pattern, when said jumper chip connects said first terminal to said third terminal to enable said second circuit pattern to provide, at an output thereof, a second signal based on the displacement of said permanent magnetic.

3. A method as claimed in claim 2, wherein said selective connection portion further comprises a fourth circuit path terminating at a fourth terminal, and said selectably connecting step further comprises the step of connecting said second and fourth terminals with a second jumper chip when said first and third terminals are connected with said jumper chip to thereby cause said circuit pattern to be said second circuit pattern.

4. A method as claimed in claim 2, wherein said selectably connecting step further comprises the step of soldering said jumper chip to said first and one of said second and third terminals.

* * * * *